(12) United States Patent
Veliadis et al.

(10) Patent No.: US 7,800,196 B2
(45) Date of Patent: Sep. 21, 2010

(54) SEMICONDUCTOR STRUCTURE WITH AN ELECTRIC FIELD STOP LAYER FOR IMPROVED EDGE TERMINATION CAPABILITY

(75) Inventors: John Victor D. Veliadis, Hanover, MD (US); Ty R. McNutt, Columbia, MD (US)

(73) Assignee: Northrop Grumman Systems Corporation, Los Angeles, CA (US)

( * ) Notice: Subject to any disclaimer, the term of this patent is extended or adjusted under 35 U.S.C. 154(b) by 10 days.

(21) Appl. No.: 12/285,138

(22) Filed: Sep. 30, 2008

(65) Prior Publication Data

US 2010/0078755 A1    Apr. 1, 2010

(51) Int. Cl.
*H01L 29/732* (2006.01)
(52) U.S. Cl. .................. 257/496; 257/77; 257/263; 257/E29.023; 257/E29.262
(58) Field of Classification Search .................. 257/77, 257/263, 496, E29.023, E29.262
See application file for complete search history.

(56) References Cited

U.S. PATENT DOCUMENTS

| 4,242,690 | A | * | 12/1980 | Temple | 257/493 |
|---|---|---|---|---|---|
| 4,805,004 | A | * | 2/1989 | Gandolfi et al. | 257/496 |
| 5,399,883 | A | * | 3/1995 | Baliga | 257/57 |
| 5,506,421 | A | * | 4/1996 | Palmour | 257/77 |
| 5,527,720 | A | * | 6/1996 | Goodyear et al. | 438/270 |
| 5,539,217 | A | * | 7/1996 | Edmond et al. | 257/77 |
| 5,637,898 | A | * | 6/1997 | Baliga | 257/330 |
| 5,710,455 | A | * | 1/1998 | Bhatnagar et al. | 257/472 |
| 5,712,502 | A | * | 1/1998 | Mitlehner et al. | 257/341 |
| 5,719,409 | A | * | 2/1998 | Singh et al. | 257/77 |
| 5,742,076 | A | * | 4/1998 | Sridevan et al. | 257/77 |
| 5,777,366 | A | * | 7/1998 | Contiero et al. | 257/355 |
| 5,831,288 | A | * | 11/1998 | Singh et al. | 257/77 |
| 5,969,378 | A | * | 10/1999 | Singh | 257/77 |
| 6,005,261 | A | * | 12/1999 | Konstantinov | 257/77 |
| 6,204,097 | B1 | * | 3/2001 | Shen et al. | 438/133 |
| 6,380,569 | B1 | * | 4/2002 | Chang et al. | 257/256 |
| 6,476,458 | B2 | * | 11/2002 | Miyajima | 257/496 |
| 6,573,128 | B1 | * | 6/2003 | Singh | 438/167 |
| 6,649,975 | B2 | * | 11/2003 | Baliga | 257/330 |
| 6,673,662 | B2 | * | 1/2004 | Singh | 438/167 |
| 6,767,783 | B2 | * | 7/2004 | Casady et al. | 438/234 |
| 6,770,911 | B2 | * | 8/2004 | Agarwal et al. | 257/77 |
| 6,855,986 | B2 | * | 2/2005 | Hsieh et al. | 257/339 |
| 6,900,523 | B2 | * | 5/2005 | Qu | 257/618 |
| 7,057,214 | B2 | * | 6/2006 | Giorgi et al. | 257/118 |
| 7,135,359 | B2 | * | 11/2006 | Agarwal et al. | 438/133 |
| 7,144,797 | B2 | * | 12/2006 | Chow et al. | 438/549 |
| 7,199,442 | B2 | * | 4/2007 | Shenoy | 257/471 |
| 7,304,363 | B1 | * | 12/2007 | Shah | 257/492 |
| 7,391,057 | B2 | * | 6/2008 | Ryu et al. | 257/77 |
| 7,468,314 | B2 | * | 12/2008 | Shenoy et al. | 438/570 |
| 7,598,576 | B2 | * | 10/2009 | Ward et al. | 257/411 |
| 2008/0265315 | A1 | * | 10/2008 | Mauder et al. | 257/330 |

* cited by examiner

*Primary Examiner*—Mary Wilczewski
(74) *Attorney, Agent, or Firm*—Andrews Kurth LLP

(57) ABSTRACT

An exemplary edge termination structure maintains the breakdown voltage of the semiconductor device after it has been sawed off the wafer and packaged by creating an electric field stop layer at a periphery of the semiconductor device. The electric field stop layer has a dopant concentration higher than that of the layer in which an edge termination is implemented, such as a drift layer or a channel layer. The electric field stop layer may be created by selectively masking the peripheries of the device during the device processing, i.e., mesa etch, to protect and preserve the highly doped material at the peripheries of the device.

16 Claims, 8 Drawing Sheets

SEMICONDUCTOR STRUCTURE WITH AN ELECTRIC FIELD STOP LAYER FOR IMPROVED EDGE TERMINATION CAPABILITY

BACKGROUND

The breakdown voltage requirement in semiconductor devices can range from a few volts to more than 10 kV, depending on the application. Referring to FIG. 1, the breakdown voltage is typically supported across a depletion region 120 of a semiconductor device, which is an insulating region within the device where the charge carriers have diffused away or have been forced away by an electric field. The depletion region 120 is typically formed between a p-doped region 130 and an n-doped region 110 (p-n junction) or at a metal semiconductor (Schottky) interface (not shown). The breakdown voltage is the maximum voltage that can be applied across the depletion region 120 of the device before the depletion region 120 collapses. For optimum device performance, the breakdown voltage of the device should be as close as possible to the intrinsic capability of the underlying semiconductor material.

The breakdown voltage of the device is often reduced by the occurrence of high electric fields either within the interior portion of the device or at the peripheries, i.e., edges, of the p-n junction or the Schottky interface. In particular, electric field crowding at these peripheries leads to premature voltage breakdown and adversely affects the breakdown voltage capability of the device. Referring again to FIG. 1, an edge region 140 represents electrical field crowding that reduces the breakdown voltage of the device.

SUMMARY

An embodiment of a semiconductor device with an edge termination structure includes a first layer on a semiconductor substrate and a second layer connected to the first layer where a plurality of sources is formed. A second dopant concentration of the second layer is higher than a first dopant concentration of the first layer. The edge termination structure is formed in the first layer and further includes an electric field stop layer at a periphery of the semiconductor device having a third dopant concentration higher than the first dopant concentration of the first layer and approximately the same as the second dopant concentration of the second layer.

Another embodiment of a semiconductor device with an edge termination structure includes a semiconductor substrate which may include a highly doped buffer layer, a drift layer connected to the semiconductor substrate, a channel layer connected to the drift layer, and a source layer that includes a plurality of sources and is connected to the channel layer. A dopant concentration of the source layer is higher than a dopant concentration of the drift layer and a dopant concentration of the channel layer. The edge termination structure is formed in the drift layer or channel layer and further includes an electric field stop layer at a periphery of the semiconductor device having a dopant concentration approximately the same as the dopant concentration of the source layer.

BRIEF DESCRIPTION OF THE DRAWINGS

Exemplary embodiments of the edge termination structure with an electric field stop layer will be described in detail with reference to the following figures, in which like numerals refer to like elements, and wherein.

DETAILED DESCRIPTION

Figure 1:
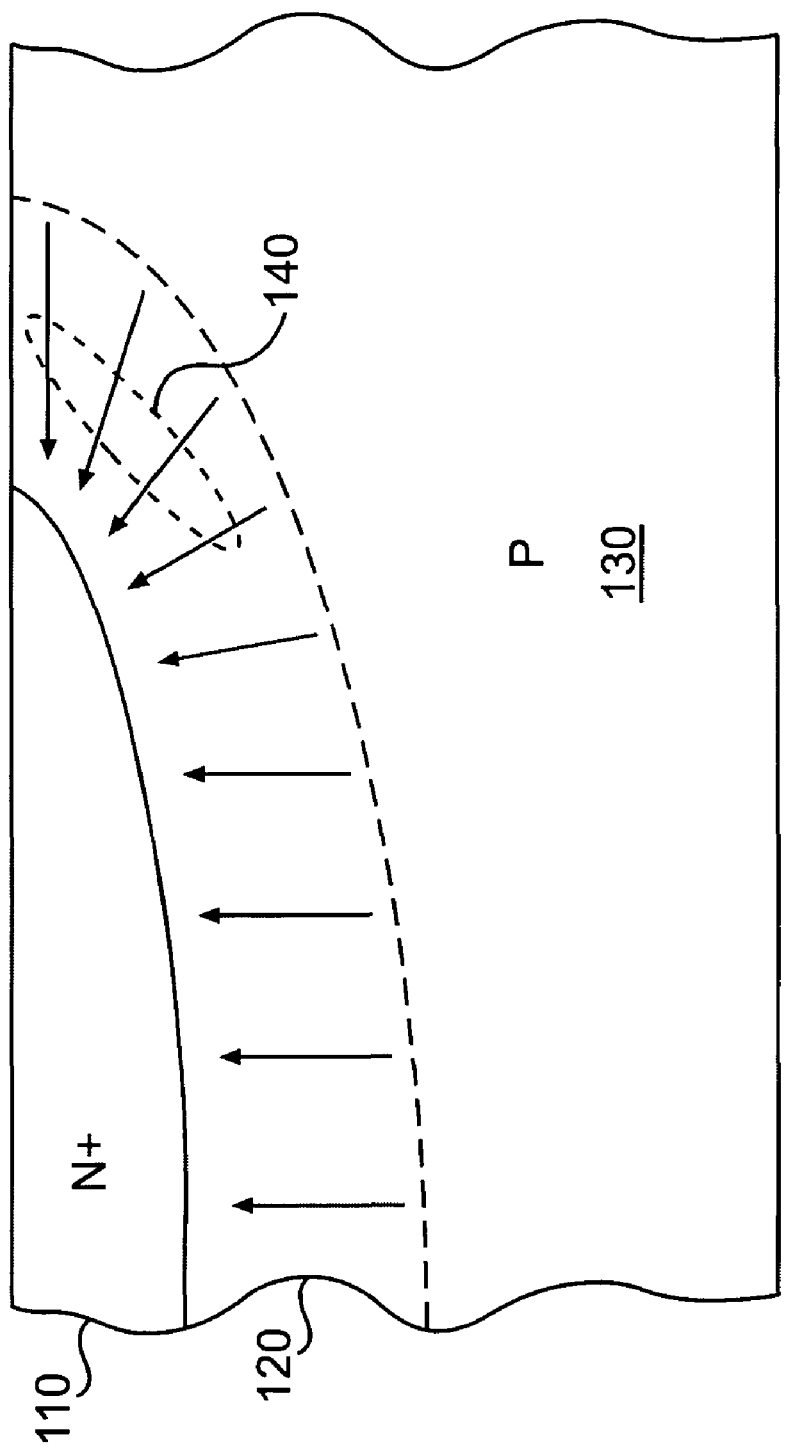
FIG. 1 illustrates electrical field crowding at an edge region of a semiconductor device which reduces breakdown voltage capability.

The following description is intended to be read in connection with the accompanying drawings, which are to be considered part of the entire written description of this invention. The drawing figures are not necessarily to scale and certain features of the invention may be shown exaggerated in scale or in somewhat schematic form in the interest of clarity and conciseness. In the description, relative terms such as "front," "back," "up," "down," "top" and "bottom," as well as derivatives thereof, should be construed to refer to the orientation as then described or as shown in the drawing figure under discussion. These relative terms are for convenience of description and normally are not intended to require a particular orientation. Terms concerning attachments, coupling and the like, such as "connected" and "attached," refer to a relationship wherein structures are secured or attached to one another either directly or indirectly through intervening structures, as well as both movable or rigid attachments or relationships, unless expressly described otherwise.

In describing various embodiments, specific terminology is employed for the sake of clarity. However, the invention is not intended to be limited to the specific terminology so selected. It is to be understood that each specific element includes all technical equivalents which operate in a similar manner to accomplish a similar purpose.

Although certain embodiments of an edge termination structure with an electric field stop layer discussed below utilize implanted vertical junction field effect transistors (VJFETs) for illustration purposes, a person of ordinary skill in the art will readily recognize that the edge termination structure is not limited to the design and/or fabrication of this particular device, and may, in fact, be used in the design and/or fabrication of any semiconductor device (e.g., a static induction transistor (SIT), a diode, a metal oxide semiconductor field effect transistor (MOSFET), a bipolar junction transistor (BJT), an insulated-gate bipolar transistor (IGBT), and a rectifier, among others), including any vertical semiconductor device that blocks voltage. A VJFET is a type of field effect transistor that can be used as an electronically-controlled switch or as a voltage-controlled resistance. A SIT is a high power, high frequency, vertical structure device with short multi-channels. A diode is a two-terminal device having two active electrodes between which an electric current may flow. A MOSFET is a device used to amplify or switch electronic signals and composed of a channel of n-type or p-type semiconductor material. A BJT is a three-terminal device constructed of doped semiconductor material and may be used in amplifying or switching applications. An IGBT is a three-terminal power semiconductor device with high efficiency and fast switching. A rectifier is an electrical device that converts alternating current (AC) to direct current (DC), a process referred to as rectification. Moreover, while examples illustrated below may indicate specific materials and dimensions, a person of ordinary skill in the art will also recognize that certain variations and modifications may be made without departing from the spirit and scope of the various embodiments of edge termination structure.

Figure 2:
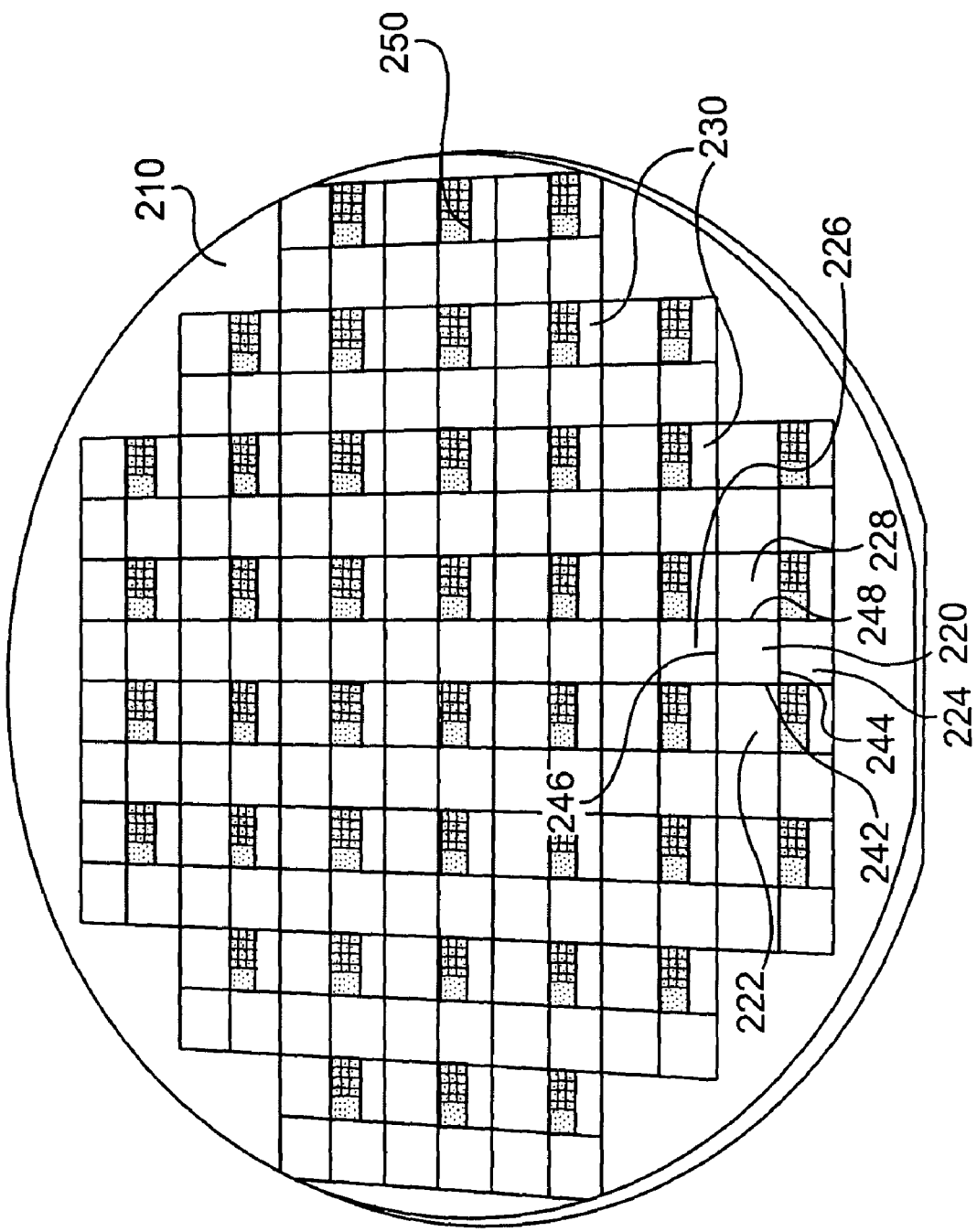
FIG. 2 illustrates an exemplary semiconductor wafer with multiple semiconductor devices at completion of the semiconductor fabrication process.

Semiconductor devices, i.e., devices, are fabricated on a semiconductor wafer by standard clean-room fabrication techniques. FIG. 2 illustrates an exemplary semiconductor wafer 210 with multiple semiconductor devices 220, 230 (i.e., devices) at completion of fabrication. The semiconductor devices 220, 230 may be, for example, silicon carbide (SiC) power devices. The exemplary edge termination structure is described with respect to a silicon carbide (SiC) power device because SiC exhibits high breakdown voltage, lower thermal impedance due to superior thermal conductivity, higher frequency performance, higher maximum current, higher operating temperature, wider band-gap, and improved reliability, particularly in harsh environments. However, one skilled in the art will appreciate that the edge termination structure is applicable to various other semiconductor materials, including but not limited to diamond, Galium Arsenide (GaAs), and Galium Nitride (GaN) based material like III-N nitrides such as Aluminum Galium Nitride (AlxGaN1-x)/GaN, and Indium Galium Nitride (InyGa1-yN)/GaN.

FIG. 2 shows two device sizes of the semiconductor devices 220, 230 and a test structure and characterization area 250. The device 220 has neighboring devices 222, 224, 226, 228 at its peripheries, i.e., edges 242, 244, 246, 248.

Figure 3:
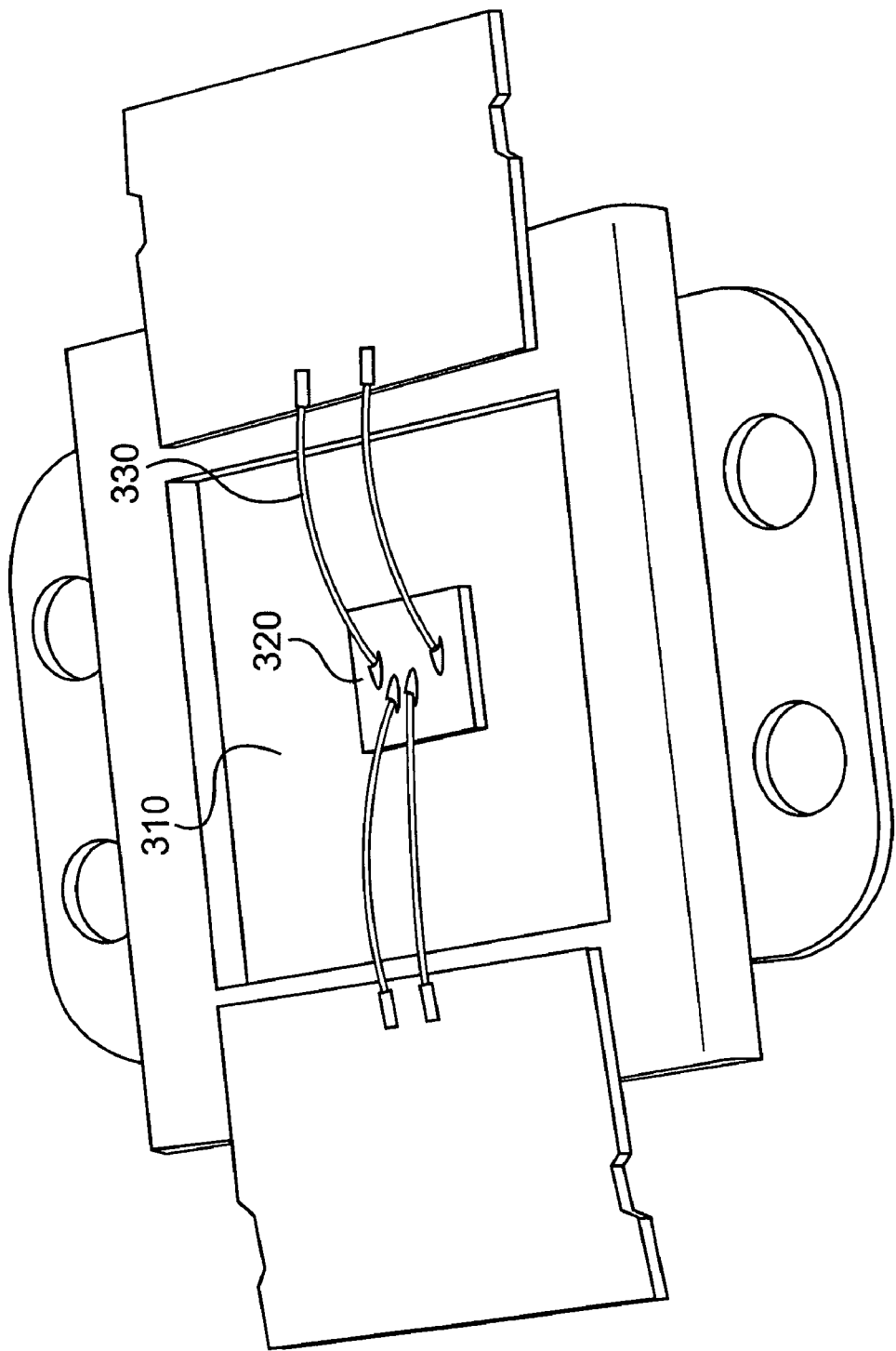
FIG. 3 illustrates one of the semiconductor devices of FIG. 2 after it is sawed off the wafer and packaged and wire bonded.

FIG. 3 illustrates a packaged and wire bonded semiconductor device 220 after it is sawed off the wafer 210 after completion of fabrication and on-wafer testing. The semiconductor device (shown as 320 in FIG. 3) is attached to a package 310 and connected using wire bonds 330 for the purpose of performing electronic functions.

As noted above, electric field crowding at peripheries, i.e., edges, of a semiconductor device may lead to premature voltage breakdown, which adversely affects the breakdown voltage capability of the device. To minimize premature voltage breakdown at peripheries of the device, specialized edge termination techniques have been developed to reduce or prevent the electric field crowding at the peripheries of the device. The two primary techniques for terminating high voltage blocking devices made of compound semiconductors are junction termination extensions (JTE) and multiple floating guard ring edge termination.

With respect to the JTE, a p-type doped region is formed at the periphery of the main p/n junction for precise control of the depletion region charge. Implementing the JTE edge termination in a lightly doped drift layer or a channel layer (as opposed to the heavily doped source layer) is advantageous as it allows for lower doping levels and energies and for an electric field distribution at a lower differential (dE/dx or dE/dy) that increases breakdown voltage capability. Implementing the JTE edge termination in a lightly doped drift layer or a channel layer requires etching away the heavily n-doped source layer material in the periphery of the device.

The multiple floating guard ring edge termination reduces the amount of field crowding at the main junction by spreading the depletion layer past consecutively lower potential floating junctions (rings). These independent junctions act to increase the depletion layer spreading, thereby decreasing the high electric field at the edges of the main junction. It is also advantageous to implement the multiple floating guard ring edge termination in the lightly doped drift layer or the channel layer (as opposed to the heavily doped source layer) as this allows for wider spacing between guard rings and thus can increase fabrication tolerances. Implementing the floating guard ring edge termination in a lightly doped drift layer or a channel layer requires etching away the heavily n-doped source layer material in the periphery of the device.

Other examples of edge termination techniques include moat etch, surface implantation, bevel edge, and field plate terminations. Regarding the bevel edge termination, the periphery of the device has a sloped etch that terminates deep into the drift layer.

Figure 4:
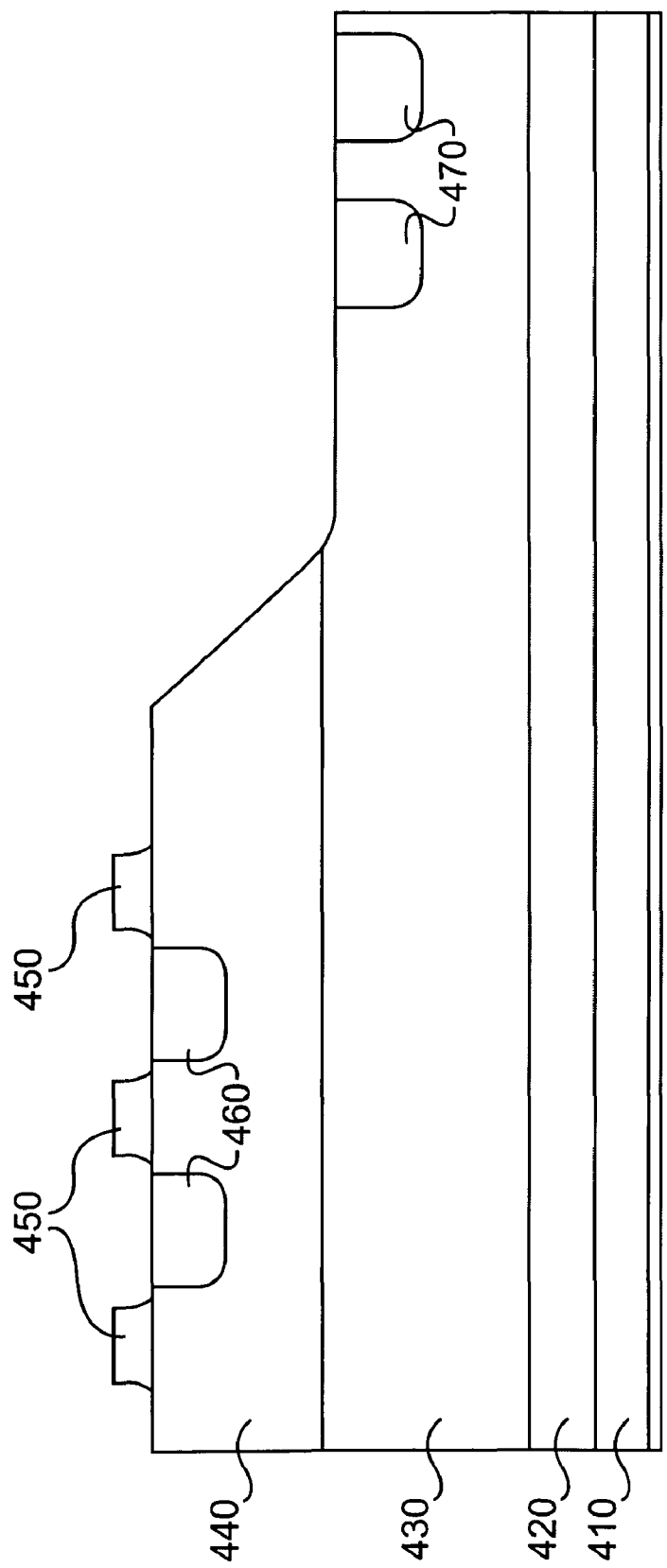
FIG. 4 illustrates an exemplary edge termination method in which a multiple floating guard ring edge termination structure is implemented in a drift layer or a channel layer, as opposed to a source layer.

FIG. 4 illustrates an exemplary floating guard ring edge termination structure implemented in a drift layer 430, as opposed to a source layer 450 in which sources are formed. The drift layer 430 typically has a dopant concentration of, for example, $5 \times 10^{14}$-$5 \times 10^{15}$ cm$^{-3}$ and may also be referred to as a lower or lightly doped drift layer or an n– drift layer. The channel layer 440 typically has a dopant concentration of, for example, $8 \times 10^{15}$-$8 \times 10^{16}$ cm$^{-3}$, and may also be referred to as an n channel layer. The source layer typically has high dopant concentration of, for example, more than $10^{18}$ cm$^{-3}$ and may also be referred to as a heavily or highly doped source layer, a top layer, or an n+ source layer.

Electrical current flows from the drain layer 410 to the source layer 450 and is controlled by gates 460. A highly doped n+ buffer layer (not shown) and a highly doped n+ substrate layer 420 may be positioned between the drift layer 430 and the drain layer 410. Guard rings 470 are implanted in the drift layer 430 as shown in FIG. 4. However, one skilled in the art will appreciate that the guard rings 470 can also be implanted in the channel layer 440. Placing the edge termination in the lower doped drift layer 430 or channel layer 440 can maximize the voltage breakdown while allowing for higher processing tolerance as the guard rings 470 need not be spaced very close together to achieve depletion region overlap. If, on the other hand, the edge termination is placed in the highly doped n+ source layer, the guard rings 470 need to be spaced very close together to achieve depletion region overlap. Closer guard ring spacings reduce processing tolerance, which can lead to lower semiconductor device yields and therefore increased manufacturing costs.

Figure 5:
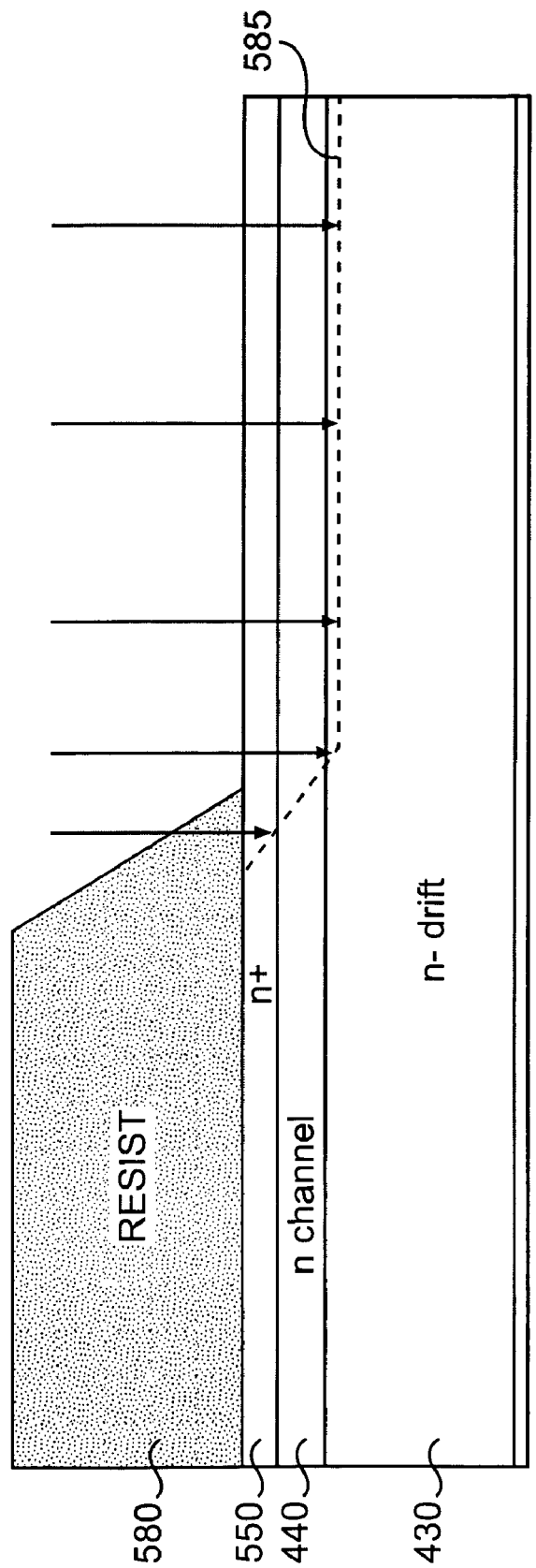
FIG. 5 illustrates an exemplary semiconductor device processing that begins by etching a vertical or sloped mesa down to the drift layer or the channel layer with no electric field stop layer at the periphery of the device.

Given the advantage of implementing the guard rings 470 or JTE in the drift layer 430 or the channel layer 440, semiconductor device processing typically begins by etching a vertical or sloped mesa along a dotted line 585 down to the drift layer 430 or the channel layer 440 using a resist mask 580, as shown in FIG. 5. Although a resist mask 580 is used to etch the vertical or sloped mesa for illustration purposes, a person of ordinary skill in the art will readily recognize that the mesa etch can be performed using a combination of a resist, dielectric, and metal masks, or other standard lithographic selective etch masking techniques. The active area of the device is formed on top of the mesa. As noted above, the semiconductor device may be, for example, a SiC power device. The edge termination is formed in the lightly doped drift layer 430 or the channel layer 440 that surrounds the mesa, as opposed to a source layer 550 in which the sources 450 are formed.

Referring back to FIGS. 2 and 3, at completion of wafer processing, the device 220 is sawed off the wafer 210 and packaged. Package testing reveals that the breakdown voltage of the packaged and wire bonded device 320 is well below the breakdown voltage of that same device 220 when it is measured on the wafer 210. The reason is: when the device 220 is on the wafer 210, the periphery of the wafer 210 and the neighboring devices 222, 224, 226, 228 have highly doped n+ material, allowing the device 220 to have a highly doped n+ electric field stop layer at its peripheries, i.e., edges 242, 244, 246, 248, which enables high breakdown voltage capability.

When the device 220 is sawed off the wafer 210 and packaged, because the edge termination is implemented in the lightly doped drift layer 430 or the channel layer 440 (both shown in FIG. 4) and the highly doped n+ material in the source layer is removed at the peripheries of the device 220, only lightly doped n− material remains at the peripheries. In other words, there is no connection with highly doped n+ material at the peripheries of the sawed off device. As a result, the device 320 experiences a reduction in breakdown voltage when sawed off the wafer 210 and packaged.

Figure 6:
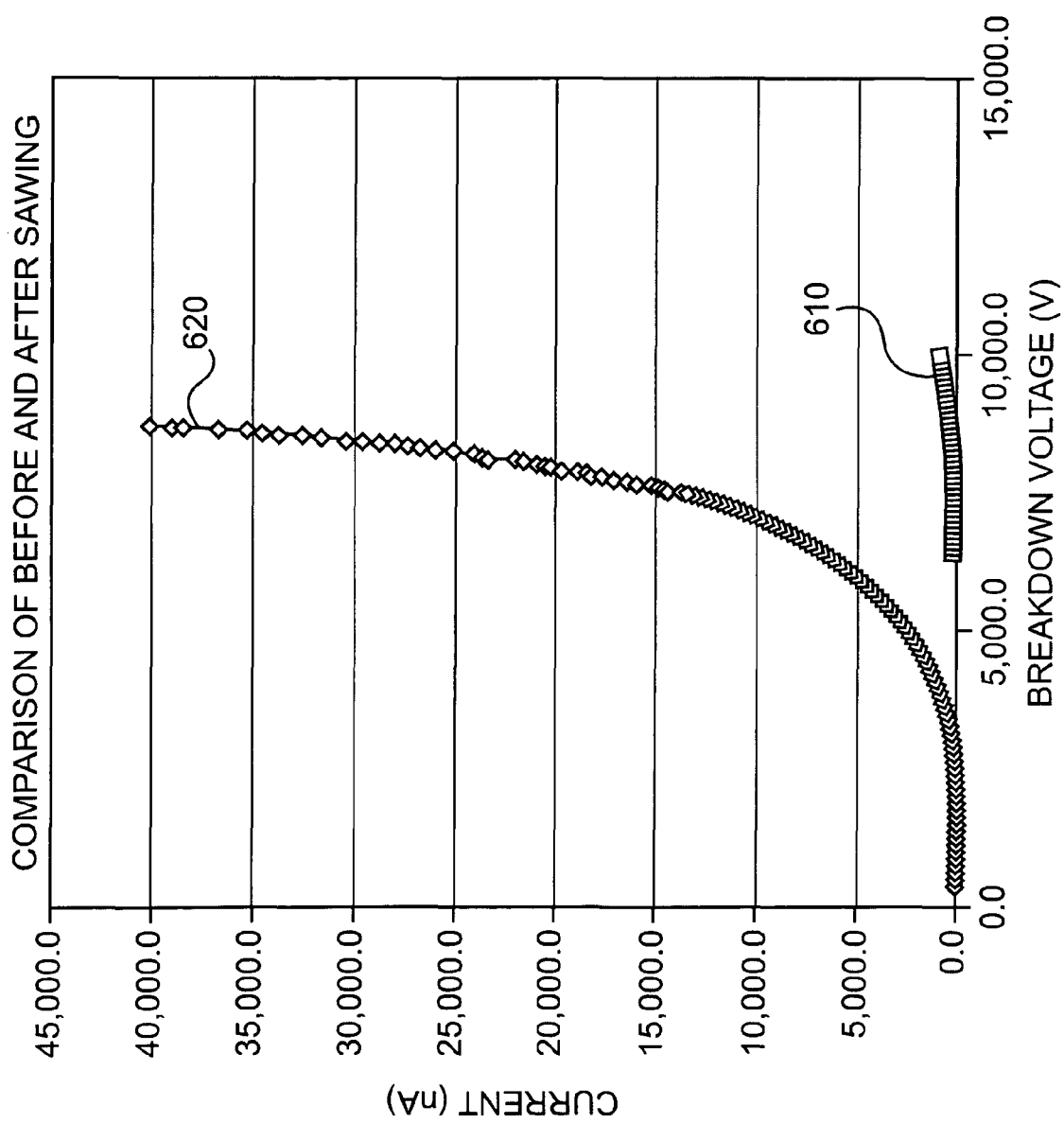
FIG. 6 illustrates breakdown voltage measurements of an exemplary semiconductor device both before and after the semiconductor device is sawed off a wafer and packaged.

FIG. 6 illustrates the reduction in breakdown voltage after sawing the semiconductor device off the wafer. When the device 220 is on the wafer 210, the breakdown voltage 610 of the device 220 is about 9 kV. After the device 320 is sawed off the wafer 210 and packaged, the breakdown voltage 620 degrades to about 4 kV.

Figure 7:
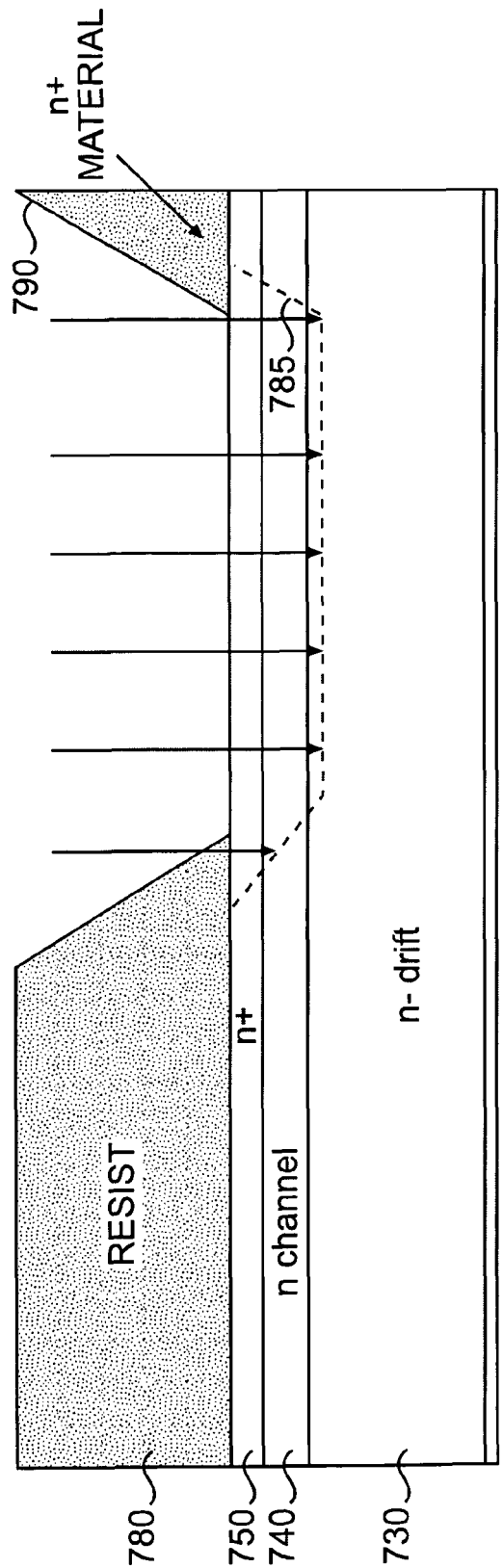
FIG. 7 illustrates an exemplary semiconductor device processing that begins by etching a vertical or sloped mesa down to the drift layer or the channel layer with an electric field stop layer present at the periphery of the device—the electric field stop layer maintaining the breakdown voltage of the semiconductor device after it has been sawed off the wafer and packaged.
Figure 8:
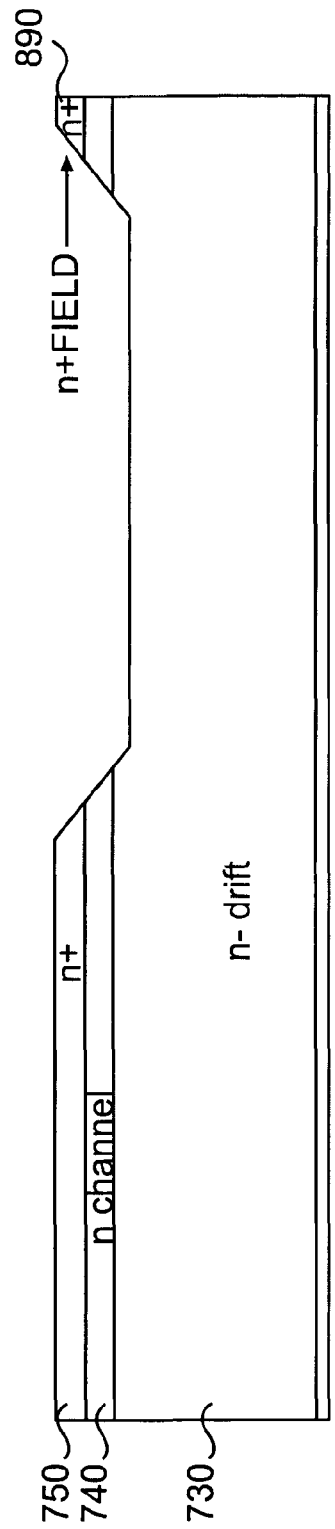
FIG. 8 illustrates the electric field stop layer at the periphery of the semiconductor device after a vertical or sloped mesa has been etched down to the drift layer or the channel layer.

FIGS. 7 and 8 illustrate an exemplary edge termination structure that maintains the breakdown voltage of the semiconductor device after it has been sawed off the wafer and packaged. As noted above, the semiconductor device processing typically begins by etching a vertical or sloped mesa along a dotted line 785 down to a drift layer 730 or the channel layer 740 using a resist or other standard lithography selective etch mask 780. The active area of the device is formed on top of the mesa. The edge termination is formed in the lightly doped drift layer 730 or the channel layer 740 that surrounds the mesa, as opposed to a source layer 750 in which sources are formed.

The material in the substrate layer 420 (shown in FIG. 4) is typically highly n+ doped material, i.e., with high n dopant concentration, for example. To maintain the breakdown voltage after the device 320 (shown in FIG. 3) is sawed off the wafer 210 (shown in FIG. 2), an electric field stop layer 890 (shown in FIG. 8), i.e., n+ field stop layer, having highly doped n+ material may be created at the peripheries of the device 320 to terminate the electric field distribution. The n+ field stop layer 890 by default exists when the device 220 is on the wafer 210 because the periphery of the wafer 210 and the neighboring devices 222, 224, 226, 228 (shown in FIG. 2) have highly doped n+ material.

Referring to FIGS. 7 and 8, the electric field stop layer 890 may be created using a resist mask 790 at the peripheries of the device during the device processing. The resist mask 790 protects and preserves the highly doped n+ material at the peripheries of the device during etching of the mesa to the drift layer 730 or the channel layer 740. The resist mask 790 may be, for example, 4 microns thick and 15-40 micros wide. One skilled in the art will appreciate that other depths and widths of the resist mask 790 can be used to create the electric field stop layer 890.

The device processing, i.e., mesa etch, can be performed along a slope or vertically, and can be done with any standard lithographic selective etch masking method combination of a resist pattern, a dielectric pattern, or a metal pattern. The structure at completion of the mesa etch is shown in FIG. 8. The highly doped n+ material is present at the peripheries of the device to serve as the electric field stop layer 890 during high reverse voltage bias.

Figure 9:
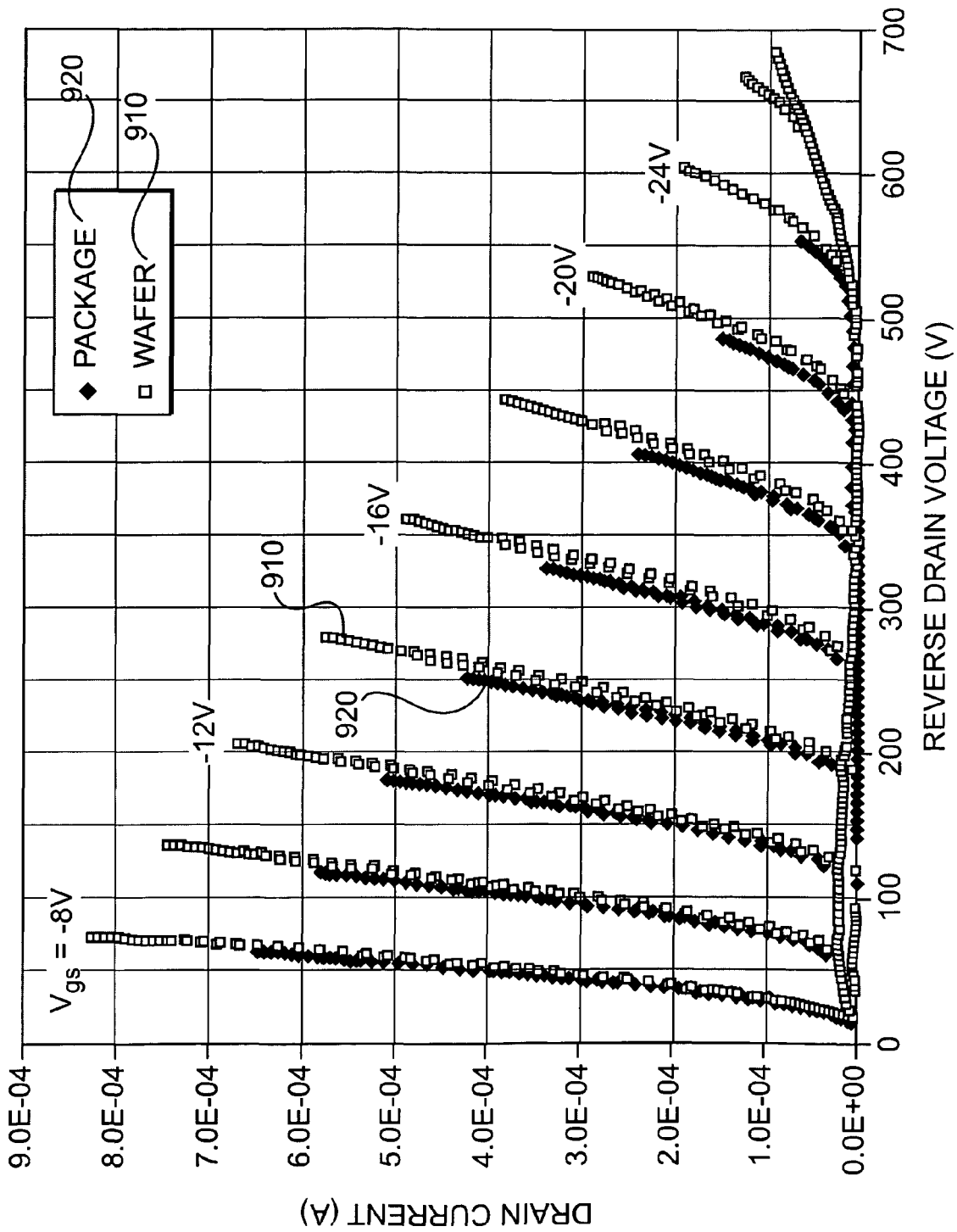
FIG. 9 illustrates that the breakdown voltage of a packaged semiconductor device with an electric field stop layer is identical or almost identical to the breakdown voltage of the device on the wafer.

By implementing the electric field stop layer 890, the breakdown voltage of the device 320 (shown in FIG. 3) when sawed off the wafer 210 (shown in FIG. 2) and packaged is approximately equal to the breakdown voltage of the same device 220 (shown in FIG. 2) when it is on the wafer. In other words, no degradation of breakdown voltage occurs once the device 320 is sawed off the wafer and packaged. This result is shown in FIG. 9. The breakdown voltage 920 of a packaged 600-V SiC VJFET power device is identical or almost identical to the breakdown voltage 910 of the device on the wafer.

While the embodiments of the electric field stop layer edge termination structure are described with respect to the JTE and multiple floating guard ring edge termination techniques, one skilled in the art will appreciate that the electric field stop layer edge termination structure can be equally applied to other edge termination techniques. For example, the bevel edge termination method can take advantage of the n+ field stop layer 890 because the process of etching a deep sloped mesa around the device also depletes the highly doped n+ material at the peripheries of the device.

The foregoing detailed description merely illustrates the principles of the edge termination structure with an electric field stop layer. It will thus be appreciated that those skilled in the art will be able to devise various arrangements which, although not explicitly described or shown herein, embody the principles of the edge termination structure and are thus within its spirit and scope.

What is claimed is:

1. An edge termination structure for a semiconductor device, comprising:
    a first n-type semiconductor layer having a first dopant concentration and situated on a top surface of a semiconductor substrate;
    a second n-type semiconductor layer having a second dopant concentration that is higher than the first dopant concentration of the first n-type semiconductor layer, and situated on a top surface of the first n-type semiconductor layer, wherein the first n-type semiconductor layer is sandwiched between the semiconductor substrate and the second n-type semiconductor layer;
    a mesa extending through the second n-type semiconductor layer and terminating into the first n-type semiconductor layer, wherein the edge termination structure is formed in the first n-type semiconductor layer surrounding a bottom of the mesa; and
    an n-type electric field semiconductor stop layer formed at a periphery of the semiconductor device having a third dopant concentration higher than the first dopant concentration of the first n-type semiconductor layer and approximately the same as the second dopant concentration of the second n-type semiconductor layer, wherein a top surface of the n-type electric field semiconductor stop layer is at a same elevation as a top surface of the second n-type semiconductor layer.

2. The structure of claim 1, wherein the mesa is etched along a slope.

3. The structure of claim 1, wherein the mesa is etched vertically.

4. The structure of claim 1, wherein the mesa is etched using one or more of a resist pattern, a dielectric pattern, and a metal pattern.

5. The structure of claim 1, wherein the electric field stop layer is formed at the periphery of the semiconductor device after etching the mesa.

6. The structure of claim 1, wherein the semiconductor device is selected from the group consisting of a silicon carbide (SiC), a diamond, a Galium Arsenide (GaAs), a Galium Nitride (GaN), an Aluminum-Galium-Nitride/Galium-Nitride, and an Indium-Galium-Nitride/Galium-Nitride material based power device.

7. The structure of claim 1, wherein when the semiconductor device is sawed off a wafer and packaged, a second breakdown voltage of the semiconductor device is approximately the same as a first breakdown voltage of the semiconductor device when the semiconductor device is on the wafer.

8. The structure of claim 1, wherein the semiconductor device is a vertical semiconductor device that blocks voltage.

9. The structure of claim 8, wherein the vertical semiconductor device is one of a vertical-junction field-effect-transistor (VJFET), an ion-implanted static induction transistor (SIT), a diode, a metal-oxide-semiconductor field-effect-transistor (MOSFET), a bipolar junction transistor (BJT), an insulated-gate bipolar transistor (IGBT), and a rectifier.

10. An edge termination structure for a semiconductor device, comprising:
an n-type semiconductor substrate;
an n-type semiconductor drift layer situated on a top surface of the n-type semiconductor substrate;
an n-type semiconductor channel layer situated on a top surface of the n-type semiconductor drift layer, wherein the n-type semiconductor draft layer is sandwiched between the n-type semiconductor substrate and the n-type semiconductor channel layer;
an n-type semiconductor source layer situated on a top surface of the n-type semiconductor channel layer, wherein the n-type semiconductor channel layer is sandwiched between the n-type semiconductor drift layer and the n-type semiconductor source layer, and wherein a dopant concentration of the source layer is higher than a dopant concentration of the drift layer and a dopant concentration of the channel layer;
a mesa extending through the n-type semiconductor source layer, wherein the edge termination structure is formed in an area surrounding a bottom of the mesa; and
an n-type electric field semiconductor stop layer formed at a periphery of the semiconductor device having a dopant concentration approximately the same as the dopant concentration of the n-type semiconductor source layer, wherein a top surface of the n-type electric field semiconductor stop layer is at a same elevation as a top surface of the n-type semiconductor source layer.

11. The structure of claim 10, wherein the bottom of the mesa is in the n-type semiconductor drift layer.

12. The structure of claim 10, wherein the bottom of the mesa is in the n-type semiconductor channel layer.

13. The structure of claim 10, wherein the electric field stop layer is formed at the periphery of the semiconductor device after etching a mesa.

14. The structure of claim 10, wherein the semiconductor device is selected from the group consisting of a silicon carbide (SiC), a diamond, a Galium Arsenide (GaAs), a Galium Nitride (GaN), an Aluminum-Galium-Nitride/Galium-Nitride, and an Indium-Galium-Nitride/Galium-Nitride material based power device.

15. The structure of claim 10, wherein when the semiconductor device is sawed off a wafer and packaged, a second breakdown voltage of the semiconductor device is approximately the same as a first breakdown voltage of the semiconductor device when the semiconductor device is on the wafer.

16. The structure of claim 10, wherein the semiconductor device is a vertical semiconductor device that blocks voltage and is selected from a group consisting of a vertical-junction field-effect-transistor (VJFET), an ion-implanted static induction transistor (SIT), a diode, a metal-oxide-semiconductor field-effect-transistor (MOSFET), a bipolar junction transistor (BJT), an insulated-gate bipolar transistor (IGBT), and a rectifier.

* * * * *